(12) United States Patent
Ashkhmin et al.

(10) Patent No.: US 7,168,028 B2
(45) Date of Patent: Jan. 23, 2007

(54) METHOD AND APPARATUS FOR MAP DECODING OF BINARY HAMMING CODES AND RELATED ERROR CORRECTION CODES

(75) Inventors: Alexei Ashkhmin, Morristown, NJ (US); Simon Litsyn, Giv'at Shmuel (IL)

(73) Assignee: Lucent Technologies Inc., Murray Hill, NJ (US)

( * ) Notice: Subject to any disclaimer, the term of this patent is extended or adjusted under 35 U.S.C. 154(b) by 637 days.

(21) Appl. No.: 10/285,365

(22) Filed: Oct. 31, 2002

(65) Prior Publication Data
US 2004/0088645 A1    May 6, 2004

(51) Int. Cl.
*H03M 13/00* (2006.01)
(52) U.S. Cl. ............... 714/777; 714/755; 714/784
(58) Field of Classification Search ............... 714/777, 714/794, 795, 786, 796; 375/341, 262
See application file for complete search history.

(56) References Cited

U.S. PATENT DOCUMENTS 5,870,414 A * 2/1999 Chaib et al. ............. 714/792
5,926,488 A * 7/1999 Khayrallah ............. 714/752
6,487,258 B1 * 11/2002 Jedwab et al. ............. 375/340

OTHER PUBLICATIONS

Williams et al., "The Theory of Error-Correcting Codes," Elsevier Science B.V., Amsterdam, The Netherlands (1977).

* cited by examiner

*Primary Examiner*—Albert Decady
*Assistant Examiner*—Esaw T. Abraham (57) ABSTRACT

A method and apparatus are disclosed for MAP decoding of signals encoded using error correction codes to make maximum probability decisions about each transmitted bit. A disclosed MAP decoding algorithm extends the work of Hartman and Rudolph and exploits properties of Hamming error correction codes to provide a decoding algorithm having a complexity that is proportional to n log n for Hamming codes. The invention computes a difference, $\rho$, of the probabilities the that transmitted symbol was zero and one based on characteristics of the channel and then determines the product of the $\rho_i$ values corresponding to non-zero positions of codewords of the dual code using real vector and $\mathcal{F}_2[\mathbb{Z}_2]$-vector fast Walsh-Hadamard transforms. The invention also processes all positions of all codewords to determine a sum for each position that indicates the reliability that a received bit is a given value for a given position using the real vector fast Walsh-Hadamard transforms.

18 Claims, 4 Drawing Sheets

METHOD AND APPARATUS FOR MAP DECODING OF BINARY HAMMING CODES AND RELATED ERROR CORRECTION CODES

FIELD OF THE INVENTION

The present invention relates to mechanisms for maximum a posteriori (MAP) decoding of signals encoded using error correction codes, and, more particularly, to MAP decoding of signals encoded using binary Hamming codes and related error correction codes.

BACKGROUND OF THE INVENTION

Error correction codes are often employed in communication systems to provide increased resilience to channel noise. Generally, error correction encoding techniques typically employ convolutional, block or concatenated coding of the data before the signal is modulated so that errors introduced by noise and interference on the channel may be corrected. One popular family of linear low rate error correction codes having large minimum distances is first order Reed-Muller codes. Each family of error correction codes has a dual code. The dual code for binary Reed-Muller codes are the binary Hamming codes.

The received signal, which is typically corrupted by the noise and interference on the channel, must be decoded at the receiver. Typically, maximum a posteriori decoding techniques are applied to decode signals encoded using error correction codes to make maximum probability decisions about each transmitted bit. For a detailed discussion of Hamming codes and the decoding thereof, see, for example, T. Kasami et al., "On the Optimum Bit Orders With Respect to the State Complexity of Trellis Diagrams for Binary Linear Codes," IEEE Trans. Inf. Theory, vol. IT-39, 242–45 (January, 1993) or T. Kasami et al, "On Complexity of Trellis Structure of Linear Block Codes," IEEE Trans. Inf. Theory, vol. IT-39, 1057–64 (January, 1993), incorporated by reference herein.

One particular implementation of the MAP decoding algorithm, commonly referred to as the BCJR algorithm, was proposed in L. R. Bahl, J. Cocke, F. Jelinek and J. Raviv, "Optimal Decoding of Linear Codes for Minimizing Symbol Error Rate", IEEE Trans. Inform. Theory, V. IT-20, 284–287 (March, 1974), incorporated by reference herein. The BCJR algorithm is a symbol-by-symbol decoder based on a trellis representation of a code. The BCJR algorithm for binary Hamming codes has a complexity that is proportional to $n^2$, where n is the code length. A need exists for a method and apparatus for decoding Hamming and extended Hamming codes having reduced complexity.

SUMMARY OF THE INVENTION

Generally, a method and apparatus are disclosed for MAP decoding of signals encoded using error correction codes to make maximum probability decisions about each transmitted bit. The disclosed MAP decoding algorithm exploits properties of Hamming error correction codes to provide a decoding algorithm with significantly reduced complexity. While conventional decoding algorithms for binary Hamming codes, such as the Hartman-Rudolph algorithm, have a complexity that is proportional to $n^3$, where n is the code length and the BCJR algorithm has complexity proportional to $n^2$, the disclosed decoding algorithm has a complexity that is proportional to n log n for Hamming and extended Hamming codes.

The disclosed MAP decoding algorithm determines the probability that a given symbol is each possible value and selects a value for each symbol based on the value having the maximum probability. The disclosed MAP decoding algorithm extends the work of Hartman and Rudolph. A first portion of the Hartman-Rudolph decoding algorithm computes a difference, ρ, in the probability of receiving a binary zero and binary one based on characteristics of the channel and received signal and then, for each codeword of the dual code, determines the product of the $ρ_l$ values corresponding to non-zero positions of codewords of the dual code, in a known manner. As used herein, the symbol "ρ" indicates the set of $ρ_l$ values for each of the 1 positions of a codeword. According to one feature of the invention, a more efficient technique for computing the product of the ρ values corresponding to non-zero positions of codewords of the dual code is provided. Generally, the present invention recognizes that in the case of Hamming codes, a real vector and a specially designed $\mathcal{F}_2[\mathbb{Z}_2]$-vector fast Walsh-Hadamard transform can be used to more efficiently compute the product of the $ρ_l$ values corresponding to non-zero positions of codewords.

A second portion of the conventional Hartman-Rudolph decoding algorithm processes all positions to determine a sum of modified products of ρ values for each position whose sign indicates the most probable value of a transmitted symbol for a given position. Generally, the second portion of the Hartman-Rudolph decoding algorithm goes through each position of the code and modifies the products of the $ρ_l$ values (computed by the first aspect) and then sums the modified products of $ρ_l$ values. For a given position of each dual codeword, the initial product of $ρ_l$ values (computed by the first aspect) is (i) divided by the $p_l$ value for the current position if the dual codeword has a binary one (1) in the current position, and (ii) multiplied by the $ρ_l$ value for the current position if the dual codeword has a binary zero (0) in the current position. According to another feature of the invention, a more efficient technique for computing the sum of modified products of the $ρ_l$ values for each position is provided. Generally, the present invention recognizes that in the case of Hamming codes, the real vector fast Walsh-Hadamard transforms can be used to more efficiently compute the sum of modified products of $ρ_l$ values for each position.

A more complete understanding of the present invention, as well as further features and advantages of the present invention, will be obtained by reference to the following detailed description and drawings.

DETAILED DESCRIPTION

Figure 1:
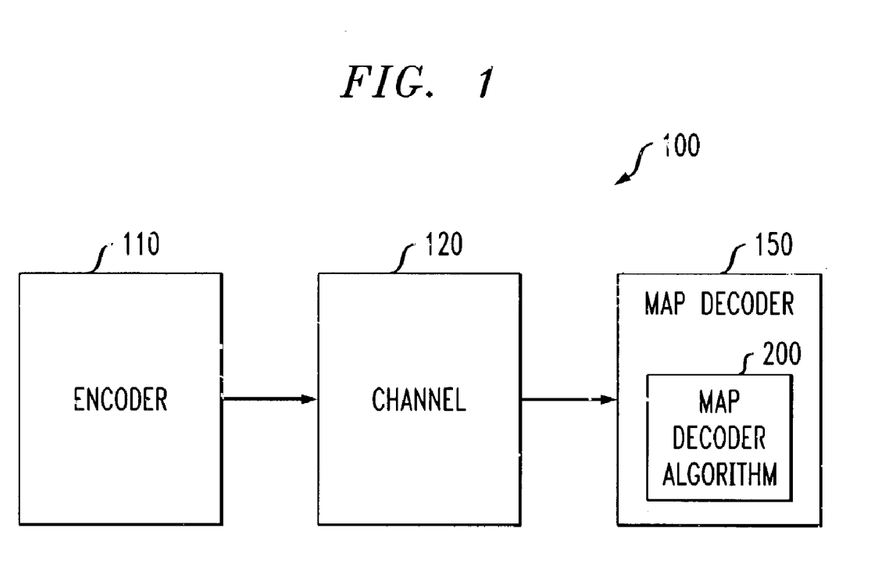
FIG. 1 illustrates a communication system in which the present invention may be employed.

FIG. 1 illustrates a communication system 100 in which the present invention may be employed. As shown in FIG. 1, the communication system 100 includes an encoder 110, a channel 120, and a maximum a posteriori decoder 150. The encoder 110 employs error correction encoding to provide increased resilience to noise on the channel 120. In particular, the exemplary encoder 110 employs extended Hamming codes or Hamming codes. As discussed hereinafter, the MAP decoder 150 employs a MAP decoding algorithm 200, discussed below in conjunction with FIG. 2, incorporating features of the present invention to make maximum probability decisions for all values of each transmitted symbol.

Figure 2A:
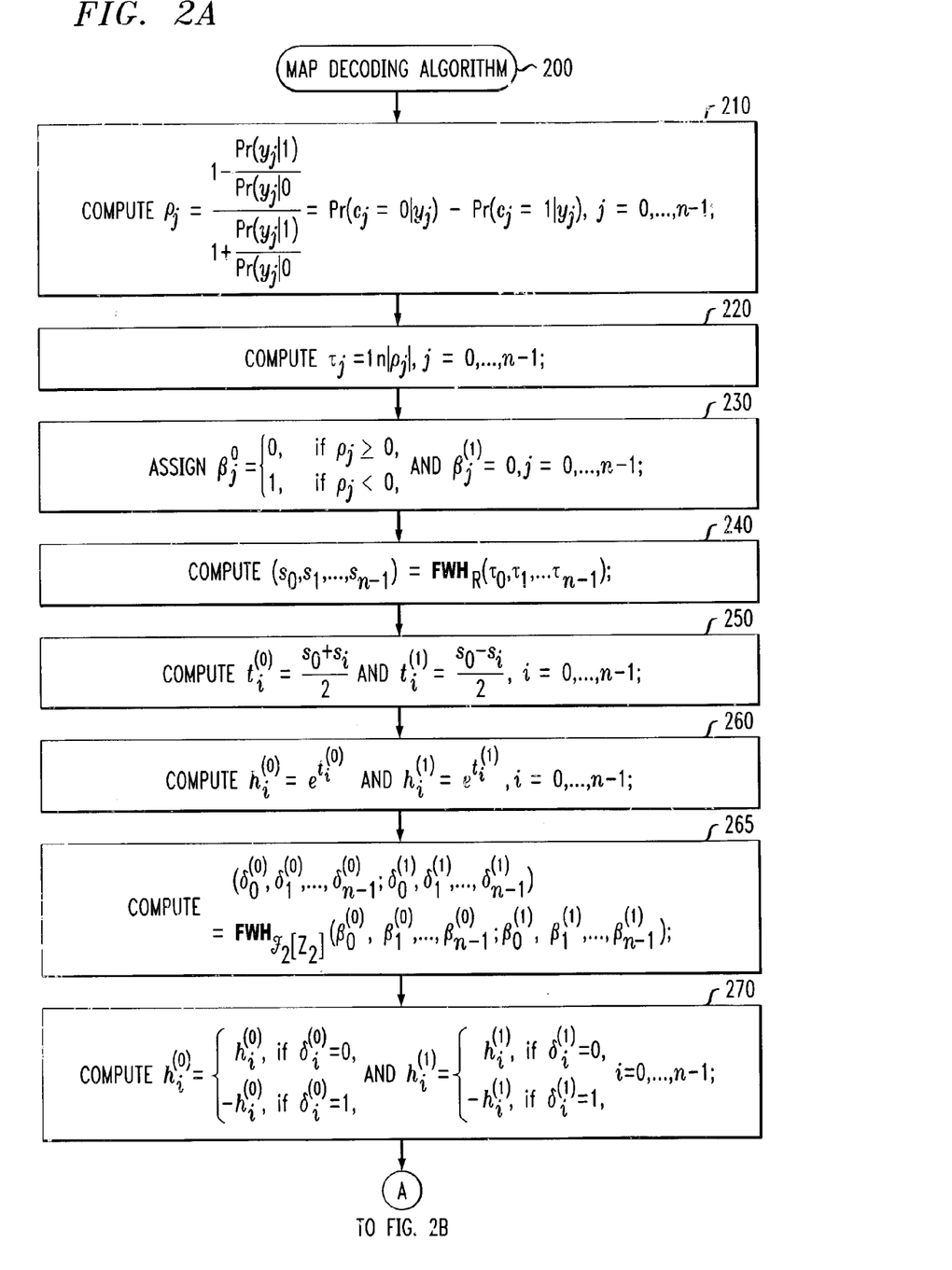
FIGS. 2A and 2B, collectively, are a flow chart describing an exemplary implementation of a MAP decoding algorithm of FIG. 1 particularly suited for decoding binary extended Hamming codes.
Figure 2B:
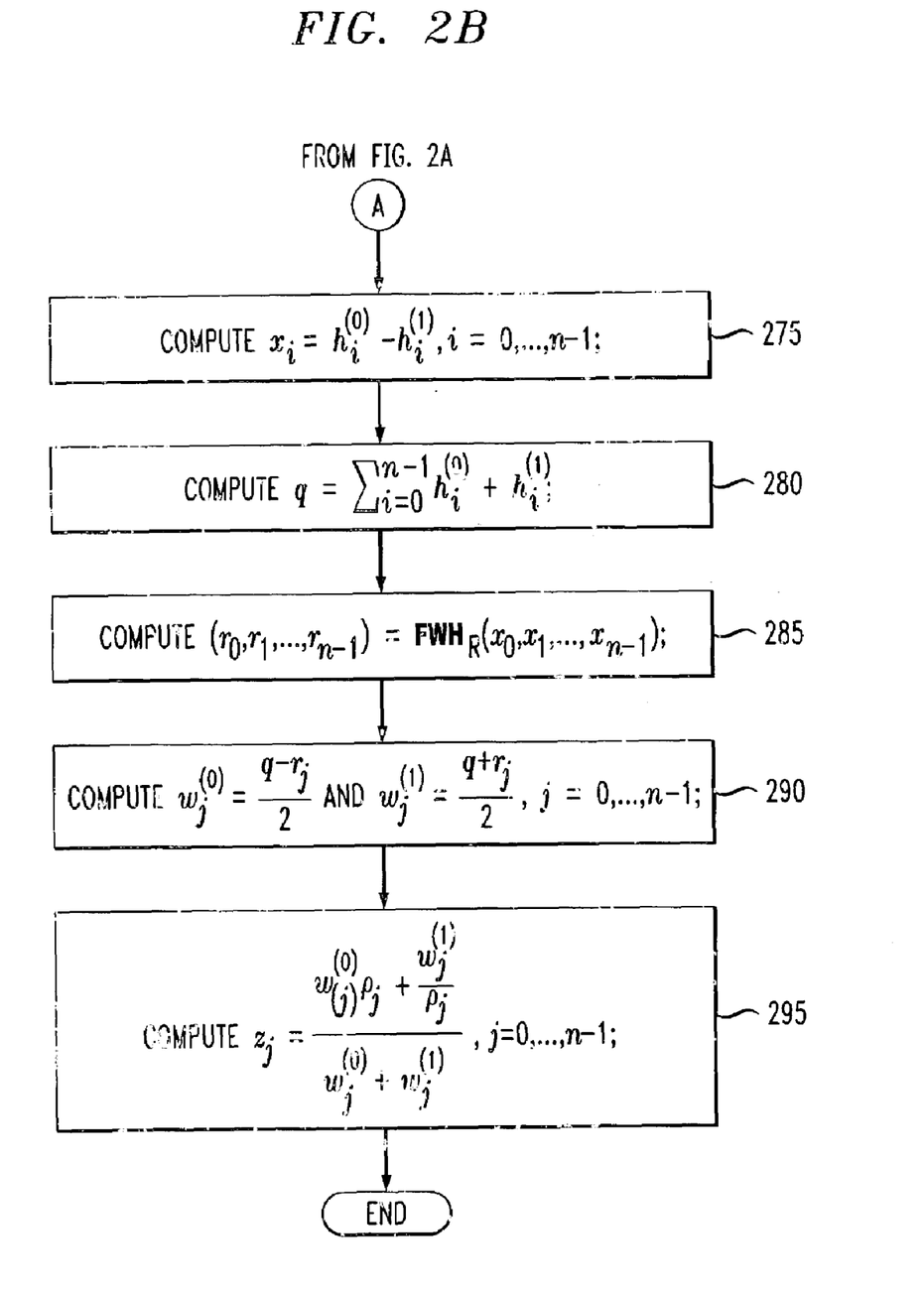

The present invention recognizes that for extended Hamming codes and Hamming codes, the complexity of conventional MAP decoding algorithms can be significantly reduced. As discussed more fully below, the disclosed MAP decoding algorithm 200 for Hamming codes has a complexity that is proportional to $n \log_2 n$. While the present invention is illustrated herein using exemplary Hamming codes, the present invention may be applied to any error correction code for which the dual of the code may be represented as a product of sparse matrices, such as Reed-Muller codes. For a detailed discussion of a system and method for decoding Reed-Muller codes, see, for example, U.S. patent application Ser. No. 10/112,574, filed Mar. 29, 2002, entitled "Method and Apparatus for MAP Decoding of First-Order Reed-Muller Codes and Related Error Correction Codes," incorporated by reference herein.

Conventional MAP Decoding of a Linear Code

Let $\mathbb{F}_q$ be the Galois field of size q (i.e., a finite field of q elements) and let C be an [n,k] linear code over $\mathbb{F}_q$. It is assumed that codewords of C are transmitted through a memoryless channel 120. Let Q be an output sampling space, either finite or infinite, of the channel 120. In the case of finite Q, it is assumed that conditional probabilities $Pr(y|\alpha)$ of receiving symbol $y \in Q$ under the condition that symbol $\alpha \in \mathbb{F}_q$ has been transmitted are known. If Q is infinite, then y is a continuous random variable whose density function, say $f_\alpha(y)$, is defined by a transmitted symbol $\alpha \in \mathbb{F}_q$. For instance, if a binary code with binary modulation is used in a channel 120 with white additive Gaussian noise then we have two density functions:

$$f_0(y) = \frac{1}{\sqrt{2\pi}\sigma} e^{-\frac{(x-1)^2}{2\sigma^2}} \text{ and } f_1(y) = \frac{1}{\sqrt{2\pi}\sigma} e^{-\frac{(x+1)^2}{2\sigma^2}}$$

where $$\sigma = \frac{n}{2k\vartheta}$$

and $\vartheta$ is the signal to noise ratio. It is assumed that functions $f_\alpha(y)$ are known for all $\alpha \in \mathbb{F}_q$. Since a memoryless channel is assumed, the conditional probability of receiving a vector $\underline{y} \in Q^n$ under the condition that a vector $\underline{c} \in \mathbb{F}_q^n$ has been transmitted, can be written as the following product:

$$Pr(\underline{y} | \underline{c}) = \prod_{j=0}^{n-1} Pr(y_j | c_j). \quad (1)$$

It is also assumed that all codewords have the same probability to be transmitted and therefore this probability equals $$\frac{1}{q^k}.$$

It is assumed that a vector $\underline{c} = (c_0, c_1, \ldots, c_{n-1}) \in C$ is transmitted and a vector $\underline{y} \in Q^n$ is received. The goal is to determine what was the j-th transmitted symbol. To do this, the conditional probabilities $Pr(c_j = \alpha | \underline{y})$ are estimated for all $\alpha \in \mathbb{F}_q$ and the maximum one is selected.

Let $C_j^{(\alpha)} = \{\underline{c} = (c_0, c_1, \ldots, c_{n-1}) \in C : c_j = \alpha\}$, i.e., $C_j^{(\alpha)}$ is the set of all codewords whose j-th symbol is $\alpha$. In the case of finite Q, using Bayes rule and equation (1), the conditional probabilities can be expressed as follows:

$$Pr(c_j = \alpha | \underline{y}) = \sum_{\underline{b} \in C_j^{(\alpha)}} Pr(\underline{c} = \underline{b} | \underline{y}) \quad (2)$$

$$= \sum_{\underline{b} \in C_j^{(\alpha)}} \frac{Pr(\underline{y} | \underline{b})}{Pr(\underline{y})} Pr(\underline{b})$$

$$= \frac{1}{q^k Pr(\underline{y})} \sum_{\underline{b} \in C_j^{(\alpha)}} \prod_{l=0}^{n-1} Pr(y_l | b_l).$$

Using similar arguments, in the case of infinite Q, the conditional probabilities can be expressed as follows:

$$Pr(c_j = \alpha | \underline{y}) = \frac{1}{q^k Pr(\underline{y})} \sum_{\underline{b} \in C_j^{(\alpha)}} \prod_{l=0}^{n-1} f_{b_l}(y_l). \quad (3)$$

The denominator of equations (2) and (3) is the same for $\alpha \in \mathbb{F}_q$. Therefore, for MAP decoding, it is enough to estimate only the sum of products of $Pr(y_l | b_j)$ or $f_{b_j}(y_l)$ for different $\alpha \in \mathbb{F}_q$ and to select the maximum one.

Hereinafter, it is assumed that Q is finite and the conditional probabilities $Pr(y_l | a)$ will be employed. In the case of infinite Q, one has to replace the conditional probabilities with density functions $f_\alpha(y_j)$.

Binary Hamming Codes

In what follows we will denote by $\oplus$ summation by mod 2. Let C be an [n, k] linear code over $\mathbb{F}_2$, and let $C^\perp$ be the dual of C. It is assumed that code words of $C^\perp$ are enumerated and denoted by $\underline{c}'$, i.e., $c_{ij}'$ is the j-th element of the i-th codeword of $C^\perp$. In what follows we will call code words of $C^\perp$ dual code words.

C. Hartman and L. Rudolph developed an algorithm for the MAP decoding of a linear code using its dual code. See, R. P. Hartman and L. D. Rudolph, "An Optimum Symbol-by-Symbol Decoding Rule for Linear Codes," IEEE Trans. Inf. Theory, vol. IT-22, 514–17 (September 1976), incorporated by reference herein. In particular, Hartman and Rudolph proved the following theorem:

Theorem 1:

$$Pr(c_j = s \mid \underline{y}) = \frac{1}{2^{n+1} Pr(\underline{y})} A_j(s), \ s \in \{0, 1\}, \quad (4)$$

where:

$$A_j(s) = \sum_{t=0}^{1} (-1)^t \sum_{i=0}^{2^{n-k}-1} \prod_{l=0}^{n-1} \left[ Pr(y_l \mid 0) + (-1)^{-(c'_{il} \oplus t\delta_{jl})} Pr(y_l \mid 1) \right]. \quad (5)$$

Generally, Hartman and Rudolph provided an algorithm that uses the dual code to decode a given code.

Let:

$$\psi_j = Pr(y_j \mid 1)/Pr(y_j \mid 0) \text{ and}$$

$$\rho_j = \frac{1 - Pr(y_j \mid 1)/Pr(y_j \mid 0)}{1 + Pr(y_j \mid 1)/Pr(y_j \mid 0)} = Pr(c_j = 0 \mid y_j) - Pr(c_j = 1 \mid y_j).$$

It was noted by Hartman and Rudolph that dividing equation (5) by $$\prod_{j=0}^{n-1} Pr(y_j \mid 0)$$

and further by $$\prod_{j=0}^{n-1} 1 + \psi_j,$$

and using identity, as follows:

$$\frac{1 + \psi_j(-1)^{-c'_{ij} \oplus \delta_{ij}}}{1 + \psi_j} = \frac{(1 - \psi_j)^{-c'_{ij} \oplus \delta_{ij}}}{1 + \psi_j},$$

the following expression is obtained:

$$A_j(0) - A_j(1) = \lambda \sum_{i=0}^{2^{n-k}-1} \prod_{l=0}^{n-1} \rho_l^{c'_{il} \oplus \delta_{jl}}. \quad (6)$$

Similarly, to evaluate the sum of probabilities, which is proportional to the sum of $A_j(0)$ and $A_j(1)$, the following is obtained:

$$A_j(0) + A_j(1) = \lambda \sum_{i=0}^{2^{n-k}-1} \prod_{l=0}^{n-1} \rho_l^{c'_{il}}. \quad (7)$$

From equations (6) and (7), it follows that $$Pr(c_j = 0 \mid \underline{y}) - Pr(c_j = 1 \mid \underline{y}) = \frac{Pr(c_j = 0 \mid \underline{y}) - Pr(c_j = 1 \mid \underline{y})}{Pr(c_j = 0 \mid \underline{y}) + Pr(c_j = 1 \mid \underline{y})} \quad (8)$$

$$= \frac{\sum_{i=0}^{2^{n-k}-1} \prod_{l} \rho_l^{c'_{il} \oplus \delta_{jl}}}{\sum_{i=0}^{2^{n-k}-1} \prod_{l} \rho_l^{c'_{il}}}.$$

It is noted that the sign of the difference in probabilities (8) can be evaluated to determine if the received data is a binary zero (0) or binary one (1), and the magnitude of the difference in probabilities can be evaluated for an indication of the reliability. The present invention provides techniques for computing equations 6 and 7 efficiently for Hamming codes. The numerator and denominator in Equation 8 can be considered as a sum of products of the $\rho_l$ values.

Initially, a first portion of the Hartman-Rudolph decoding algorithm determines the product of the $\rho_l$ values corresponding to non-zero positions of codewords of the dual code. According to one aspect of the present invention, a more efficient technique for computing the product of the $\rho_l$ values corresponding to non-zero positions of codewords of the dual code is provided. Generally, the present invention recognizes that in the case of Hamming codes, the real vector and specially designed $\mathcal{F}_2[\mathbb{Z}_2]$-vector fast Walsh-Hadamard transforms can be used to more efficiently compute the product of the $\rho_l$ values corresponding to non-zero positions of codewords.

Thereafter, a second portion of the Hartman-Rudolph decoding algorithm processes all positions to determine a sum of modified products of $\rho$ values for each position whose sign indicates the most probable value of a transmitted symbol on a given position. Generally, the second portion of the Hartman-Rudolph decoding algorithm goes through each position of the code and modifies the products of the $\rho_l$ values (computed by the first aspect) and then sums the modified products of $\rho_l$ values. For a given position of each dual codeword, the initial product of $\rho_l$ values (computed by the first aspect) is (i) divided by the $\rho_l$ value for the current position if the dual codeword has a binary one (1) in the current position, and (ii) multiplied by the $\rho_l$ value for the current position if the dual codeword has a binary zero (0) in the current position.

According to another aspect of the present invention, a more efficient technique for computing the sum of modified products of $\rho_l$ values for each position is provided. Generally, the present invention recognizes that in the case of Hamming codes, the real vector fast Walsh-Hadamard transform can be used to more efficiently compute the sum of modified products of $\rho_l$ values for each position.

The Hamming codes, $\mathcal{H}_m$, and extended Hamming codes, $\mathcal{H}_m$, are $[2^m-1, 2^m-1-m, 3]$ and $[2^m, 2^m-m-1, 4]$, respectively. They are optimal, i.e., they have the largest possible minimum distance among all codes with the same length and size. The Hamming code $\mathcal{H}_m$ can be defined as the code whose parity check matrix consists of all nonzero binary m-tuples ordered lexicographically. The extended Hamming code $\mathcal{H}_m$ is the code whose parity check matrix is constructed from the parity check matrix of $\mathcal{H}_m$ by adding to the all-zero m-tuple and then adding the all-one row. For instance, if m equals 3, then parity check matrices of $\mathcal{H}_m$ and $\hat{\mathcal{H}}_m$ are as follows:

$$H_{\mathcal{H}_m} = \begin{bmatrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{bmatrix} \text{ and } H_{\hat{\mathcal{H}}_m} = \begin{bmatrix} 1 & 1 & 1 & 1 & 1 & 1 & 1 & 1 \\ 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{bmatrix},$$

respectively. The dual of the extended Hamming code is the first order Reed-Muller code $\mathcal{RM}(1, m)$ and the dual of the Hamming code is so called the simplex code.

Consider the meaning of expression (8) on the example of codes $\mathcal{H}_3$ and $\hat{\mathcal{H}}_3$. The set of code words of the code $\mathcal{RM}_3$ and $\mathcal{S}_3$, that are dual codes of $\hat{\mathcal{H}}_3$ and $\mathcal{H}_3$, are

| positions: | 0 1 2 3 4 5 6 7 | | 1 2 3 4 5 6 7 |
|---|---|---|---|
| codewords: | | | |
| | 0 0 0 0 0 0 0 0 | | 0 0 0 0 0 0 0 |
| | 0 1 0 1 0 1 0 1 | | 1 0 1 0 1 0 1 |
| | 0 0 1 1 0 0 1 1 | | 0 1 1 0 0 1 1 |
| | 0 1 1 0 0 1 1 0 | | 1 1 0 0 1 1 0 |
| | 0 0 0 0 1 1 1 1 | | 0 0 0 1 1 1 1 |
| | 0 1 0 1 1 0 1 0 | | 1 0 1 1 0 1 0 |
| | 0 0 1 1 1 1 0 0 | | 0 1 1 1 1 0 0 |
| | 0 1 1 0 1 0 0 1 | and | 1 1 0 1 0 0 1 |
| | 1 1 1 1 1 1 1 1 | | |
| | 1 0 1 0 1 0 1 0 | | |
| | 1 1 0 0 1 1 0 0 | | |
| | 1 0 0 1 1 0 0 1 | | |
| | 1 1 1 1 0 0 0 0 | | |
| | 1 0 1 0 0 1 0 1 | | |
| | 1 1 0 0 0 0 1 1 | | |
| | 1 0 0 1 0 1 1 0 | | | respectively. It is convenient to enumerate positions from 0 to 7 for $\hat{\mathcal{H}}_3$ code and from 1 to 7 for $\mathcal{H}_3$.

Consider the first positions for $\hat{\mathcal{H}}_3$ and $\mathcal{H}_3$. Then, according to expression (8) for $\hat{\mathcal{H}}_3$, the following expression is obtained:

$$\Pr(c_1 = 0|\underline{y}) - \Pr(c_1 = 1|\underline{y}) = \frac{\begin{array}{l}\rho_1 + \rho_3\rho_5\rho_7 + \rho_1\rho_2\rho_3\rho_6\rho_7 + \rho_2\rho_5\rho_6 + \rho_1\rho_4\rho_5\rho_6\rho_7 + \rho_3\rho_4\rho_6 + \rho_1\rho_2\rho_3\rho_4\rho_5 + \rho_2\rho_4\rho_7 + \\ +\rho_0\rho_2\rho_3\rho_4\rho_5\rho_6\rho_7 + \rho_0\rho_1\rho_2\rho_4\rho_6 + \rho_0\rho_4\rho_5 + \rho_0\rho_4\rho_5 + \rho_0\rho_1\rho_3\rho_4\rho_7 + \rho_0\rho_2\rho_3 + \rho_0\rho_1\rho_2\rho_5\rho_7 \\ +\rho_0\rho_6\rho_7 + \rho_0\rho_1\rho_3\rho_5\rho_6 \\ +\rho_0\rho_1\rho_6\rho_7 + \rho_0\rho_3\rho_5\rho_6\end{array}}{\begin{array}{l}1 + \rho_1\rho_3\rho_5\rho_7 + \rho_2\rho_3\rho_6\rho_7 + \rho_1\rho_2\rho_5\rho_6 + \rho_4\rho_5\rho_6\rho_7 + \rho_1\rho_3\rho_4\rho_6 + \rho_2\rho_3\rho_4\rho_5 + \rho_1\rho_2\rho_4\rho_7 + \\ +\rho_0\rho_1\rho_2\rho_3\rho_4\rho_5\rho_6\rho_7 + \rho_0\rho_2\rho_4\rho_6 + \rho_0\rho_1\rho_4\rho_5 + \rho_0\rho_3\rho_4\rho_7 + \rho_0\rho_1\rho_2\rho_3 + \rho_0\rho_2\rho_5\rho_7\end{array}}$$

For $\mathcal{H}_3$, the following expression is obtained:

$$Pr(c_1 = 0 | r) - Pr(c_1 = 1 | r)$$

$$= \frac{\begin{array}{l}\rho_1 + \rho_3\rho_5\rho_7 + \rho_1\rho_2\rho_3\rho_6\rho_7 + \rho_2\rho_5\rho_6 + \\ \rho_1\rho_4\rho_5\rho_6\rho_7 + \rho_3\rho_4\rho_6 + \rho_1\rho_2\rho_3\rho_4\rho_5 + \rho_2\rho_4\rho_7\end{array}}{\begin{array}{l}1 + \rho_1\rho_3\rho_5\rho_7 + \rho_2\rho_3\rho_6\rho_7 + \rho_1\rho_2\rho_5\rho_6 + \\ \rho_4\rho_5\rho_6\rho_7 + \rho_1\rho_3\rho_4\rho_6 + \rho_2\rho_3\rho_4\rho_5 + \rho_1\rho_2\rho_4\rho_7\end{array}}.$$

Let $(\delta_0^{(0)}, \delta_1^{(0)}, \ldots, \delta_{n-1}^{(0)}; \delta_0^{(1)}, \delta_1^{(1)}, \ldots, \delta_{n-1}^{(1)})$ and $(\beta_0^{(0)}, \beta_1^{(0)}, \ldots, \beta_{n-1}^{(0)}; \beta_0^{(1)}, \beta_1^{(1)}, \ldots, \beta_{n-1}^{(1)})$ be binary vectors. The $\mathcal{F}_2[\mathbb{Z}_2]$-vector fast Walsh-Hadamard type transform, discussed below, may be expressed as follows:

$$(\delta_0^{(0)}, \delta_1^{(0)}, \ldots, \delta_{n-1}^{(0)}; \delta_0^{(1)}, \delta_1^{(1)}, \ldots, \delta_{n-1}^{(1)}) =$$
$$FWH_{\mathcal{F}_2[\mathbb{Z}_2]}(\beta_0^{(0)}, \beta_1^{(0)}, \ldots, \beta_{n-1}^{(0)}; \beta_0^{(1)}, \beta_1^{(1)}, \ldots, \beta_{n-1}^{(1)}):$$

1. Perform steps 2 and 3 m times
2. For j from 0 to n/2−1 compute $$\delta_j^{(0)} = \beta_{2j}^{(0)} \oplus \beta_{2j+1}^{(0)}; \quad \delta_j^{(1)} = \beta_{2j}^{(1)} \oplus \beta_{2j+1}^{(1)};$$

$$\delta_{n/2+j}^{(0)} = \beta_{2j}^{(0)} \oplus \beta_{2j+1}^{(1)}; \quad \delta_{n/2+j}^{(1)} = \beta_{2j}^{(1)} \oplus \beta_{2j+1}^{(0)};$$

3. Assign $\beta_j^{(0)} = \delta_j^{(0)}$ and $\beta_j^{(1)} = \delta_j^{(1)}$, j=0, ..., n−1;
4. The end.

For a more detailed discussion of the Walsh-Hadamard type transform, see, for example, I. J. Good, "The Interaction Algorithm and Practical Fourier Analysis," J. Royal Stat. Soc., Vol. B-20, 361–372 (1958); and R. R. Green, "A Serial Orthogonal Decoder," JPL Space Programs Summary, Vol. 37–39-IV, 247–256 (1966), incorporated by reference herein.

MAP Decoding Algorithm for Extended Hamming Codes, $\hat{\mathcal{H}}_m$

FIG. 2 is a flow chart describing an exemplary implementation of the MAP decoding algorithm 200 incorporating features of the present invention. It is noted that the exemplary MAP decoding algorithm 200 uses the sum of logarithms of probabilities (since the conventional real vector fast Walsh-Hadamard transform is defined for sums and differences), as opposed to an equivalent product of probabilities, as would be apparent to a person of ordinary skill in the art. As previously indicated, the present invention provides a more efficient implementation of the Hartman-Rudolph decoding algorithm for Hamming codes.

As discussed hereinafter, a first portion of the MAP decoding algorithm 200 (steps 210 through 270) determines the product of the $\rho_l$ values corresponding to non-zero positions of codewords of the dual code. As shown in FIG. 2, the MAP decoding algorithm 200 initially computes on step 210, the difference, $\rho$, of the probabilities that transmitted symbol $c_j$ was zero and one based on characteristics of the channel and conditional on the j-th symbol $y_j$ received from the channel, as follows:

$$\rho_j = \frac{1 - \frac{Pr(y_j | 1)}{Pr(y_j | 0)}}{1 + \frac{Pr(y_j | 1)}{Pr(y_j | 0)}} = Pr(c_j = 0 | y_j) - Pr(c_j = 1 | y_j), j = 0, \ldots, n-1.$$

Thereafter, the natural log of each ρ is computed during step 220 to permit the efficient computation of the sum of logarithms of probabilities, as opposed to an equivalent product of probabilities, as follows:

$$\sigma_j = \ln|\rho_j|, j=0, \ldots, n-1;$$

Since the polarity (+/−) of each of the probability difference values, ρ, was masked by the absolute value employed during step 220, the following β values are computed during step 230 to maintain the polarity information:

$$\beta_j^0 = \begin{cases} 0, & \text{if } \rho_j \geq 0, \\ 1, & \text{if } \rho_j < 0, \end{cases} \text{ and } \beta_j^{(1)} = 0, j = 0, \ldots, n-1.$$

The real vector Walsh-Hadamard transform is applied to the τ (magnitude) values during step 240 to find the sum of logs of ρ values, as follows:

$$(s_0, s_1, \ldots, s_{n-1}) = \mathbb{FW}_\mathbb{R}(\sigma_0, \tau_1, \ldots, \sigma_{n-1}).$$

The results of the real vector Walsh-Hadamard transform are then processed during step 250 to compute:

$$t_i^{(0)} = \frac{s_0 + s_1}{2} \text{ and } t_i^{(1)} = \frac{s_0 - s_1}{2}, i = 0, \ldots, n-1.$$

($t_i^{(0)}$ is the sum over all $\tau_j$ values, corresponding to non-zero positions of the n+i-th dual codeword and $t_i^{(1)}$ is the sum over all $\tau_j$ values, corresponding to non-zero positions of the i-th dual codeword).

Since the exemplary MAP decoding algorithm 200 employs sums of logarithms of probabilities, as opposed to an equivalent product of probabilities, exponentiation is performed during step 260, to obtain the product of p corresponding to non-zero positions for all dual codewords, as follows:

$$h_i^{(0)} = e^{t_i^{(0)}} \text{ and } H_i^{(1)} = e^{t_i^{(1)}}, i=0, \ldots, n-1.$$

Each h value is a product of the absolute value of ρ values corresponding non-zero entries for all codewords of first order Reed-Muller code. At this point, the MAP decoding algorithm 200 has products of absolute values. To prepare to reintroduce the polarity information and obtain the $\delta_j$ values, the specially designed $\mathcal{F}_2[\mathbb{Z}_2]$-vector Walsh-Hadamard transform is applied during step 265 to the β(polarity) values, as follows:

$$(\delta_0^{(0)}, \delta_1^{(0)}, \ldots, \delta_{n-1}^{(0)}; \delta_0^{(1)}, \delta_1^{(1)}, \ldots, \delta_{n-1}^{(1)}) =$$
$$FWH_{\mathcal{F}_2[\mathbb{Z}_2]}(\beta_0^{(0)}, \beta_1^{(0)}, \ldots, \beta_{n-1}^{(0)}; \beta_0^{(1)}, \beta_1^{(1)}, \ldots, \beta_{n-1}^{(1)}).$$

The polarity of the probability difference values is then reintroduced during step 270, as follows:

$$h_i^0 = \begin{cases} h_i^{(0)}, & \text{if } \delta_i^{(0)} = 0, \\ -h_i^{(0)}, & \text{if } \delta_i^{(0)} = 1, \end{cases} \text{ and } h_i^{(1)} =$$

$$\begin{cases} h_i^{(1)}, & \text{if } \delta_i^{(1)} = 0, \\ -h_i^{(1)}, & \text{if } \delta_i^{(1)} = 1, \end{cases} i = 0, \ldots, n-1.$$

A second portion of the MAP decoding algorithm 200 (steps 275 through 290) processes all positions of all dual codewords to determine a sum for each position that indicates the reliability that a received bit is a given value for a given position. Generally, the second portion of the MAP decoding algorithm 200 goes through each position of the codes and modifies the product of the $\rho_l$ values (computed by the first aspect) and then sums the modified product of $\rho_l$ values. For a given position of each dual codeword, the initial product of $\rho_l$ values (computed by the first aspect) is (i) divided by the $\rho_l$ value for the current position if the dual codeword has a binary one (1) in the current position, and (ii) multiplied by the $\rho_l$ value for the current position if the dual codeword has a binary zero (0) in the current position. For example, if the dual codeword is "1100," the product of $\rho_l$ values computed by the first portion of the algorithm is $\rho_l \rho_2$ and the modified product of $\rho_l$ values for the codeword for the first position would be $\rho_l \rho_2 / \rho_1$. Similarly, if the codeword is "0110," the product of $\rho_l$ values computed by the first portion of the algorithm is $\rho_l \rho_3$ and the modified product of $\rho_l$ values for the codeword for the first position would be $\rho_l \rho_3 \times \rho_l$.

In preparation for another real vector Walsh-Hadamard transform, the difference between h values is obtained during step 275, as follows:

$$x_i = h_i^{(0)} - h_i^{(1)}, i=0, \ldots, n-1.$$

and q is computed during step 280 to find the sum of all h values, as follows:

$$q = \sum_{i=0}^{n-1} h_i^{(0)} + h_i^{(1)}.$$

The real vector Walsh-Hadamard transform is applied during step 285, as follows:

$$(r_0, r_1, \ldots, r_{n-1}) = \mathbb{FW}_\mathbb{R}(x_0, x_1, \ldots, x_{n-1}).$$

The dual codewords are conceptually divided into two groups based on the binary value of the current position of each dual codeword, and the following values are computed during step 290:

$$w_j^{(0)} = \frac{q - r_j}{2} \text{ and } w_j^{(1)} = \frac{q + r_j}{2}, j = 0, \ldots, n-1.$$

where $w_j^{(0)}$ and $w_j^{(1)}$ are the sum of products of $\rho_l$ values corresponding to non-zero positions of dual codewords with a binary zero (0) and a binary one (1) on the j-th position, respectively. Finally, a decision is made about the received bit during step 295, as follows:

$$z_j = \frac{w_j^{(0)} \rho_j + \dfrac{w_j^{(1)}}{\rho_j}}{w_j^{(0)} + w_j^{(1)}}, j = 0, \ldots, n-1.$$

It is noted that the first term in the numerator multiplies the initial product of $\rho_l$ values (computed by the first aspect) by the $\rho_l$ value for the current position (if the codeword has a binary zero (0) in the current position) and the second term in the numerator divides the initial product of $\rho_l$ values (computed by the first aspect) by the $\rho_l$ value for the current position (if the codeword has a binary one (1) in the current position). Thus, $w_j^{(0)} \rho_j$ and $w_j^{(1)}/\rho_j$ are sums of modified products of $\rho$ values. This allows avoiding computations of modified products for all dual cadewords on step 295, thus contributing to the efficiency gains of the present invention.

The following discussion establishes that the MAP decoding algorithm 200 actually computes equation (8). Let $I_i^0$ and $I_i^{(1)}$ be the sets of positions where the i-th codeword of $\mathcal{RM}(1, m)$ has zeros and ones respectively.

From the definition of $\mathbb{FW}_\mathbb{R}$ one can easily see that Step 240 provides:

$$s_i = \sum_{j \in I_i^{(0)}} \ln|\rho_j|, - \sum_{j \in I_i^{(1)}} \ln|\rho_j|, i = 0, \ldots, 2^m - 1.$$

Noting that $$s_0 = \sum_{j=0}^{n-1} \ln|\rho_j|,$$

the following is obtained:

$$t_i^{(0)} = \sum_{j \in I_i^{(0)}} \ln|\rho_j| \text{ and } t_i^{(1)} = \sum_{j \in I_i^{(1)}} \ln|\rho_j|.$$

From the definition of FWH $\mathcal{F}_{2[Z_2]}$ one can see that step 270 provides:

$$\delta_i^{(0)} = \sum_{j \in I_i^{(0)}} \beta_j^{(0)} \text{ and } \delta_i^{(1)} = \sum_{j \in I_i^{(1)}} \beta_j^{(0)}, i = 0, \ldots, 2^m - 1.$$

Thus, $\delta_j^{(0)}$ and $\delta_j^{(1)}$ provide signs of the products $$\prod_{j \in I_i^{(0)}} \rho_j$$

and $$\prod_{j \in I_i^{(1)}} \rho_j$$

respectively. Hence, $$h_i^{(0)} = \prod_{j \in I_i^{(0)}} \rho_j \text{ and } h_i^{(1)} = \prod_{j \in I_i^{(1)}} \rho_j, i = 0, \ldots, 2^m - 1$$

It can be seen that:

$$r_j = \sum_{\mathcal{L}_i \in C_j^{(0)}} \left[ \prod_{l \in I_i^{(0)}} \rho_l - \prod_{l \in I_i^{(1)}} \rho_l \right] + \sum_{\mathcal{L}_i \in C_j^{(1)}} \left[ \prod_{l \in I_i^{(1)}} \rho_l - \prod_{l \in I_i^{(0)}} \rho_l \right].$$

Taking into account the following equality:

$$q = \sum_{\mathcal{L}_i \in C} \left[ \prod_{j \in I_i^{(0)}} \rho_j + \prod_{j \in I_i^{(1)}} \rho_j \right],$$

the following is obtained:

$$w_j^{(0)} = \sum_{\mathcal{L}_i \in C_j^{(0)}} \prod_{l \in I_i^{(0)}} \rho_l \text{ and } w_j^{(1)} = \sum_{\mathcal{L}_i \in C_j^{(1)}} \prod_{l \in I_i^{(1)}} \rho_l.$$

Finally, $$z_j = \frac{A_j(0) - A_j(1)}{A_j(0) + A_j(1)} = Pr(c_j = 0|\underline{y}) - Pr(c_j = 1|\underline{y}).$$

To examine the complexity of the algorithm, it is noted that complexities of all steps except steps 240, 270, and 285 are linear, the steps 240 and 270 require n $\log_2$n summations of real numbers, and step 270 requires 2n $\log_2$n binary summations. Therefore, the overall complexity of the algorithm is proportional to n $\log_2$n.

MAP Decoding Algorithm for Hamming Codes, $\mathcal{H}_m$

In the case of the Hamming code, $\mathcal{H}_m$, a vector ($y_1$, $y_2$, ..., $y_n$) is received from the channel. Using arguments similar to those discussed above, one can easily see that the following algorithm provides a MAP decoding of the Hamming code and its complexity is proportional to n $\log_2$n.

Figure 3:
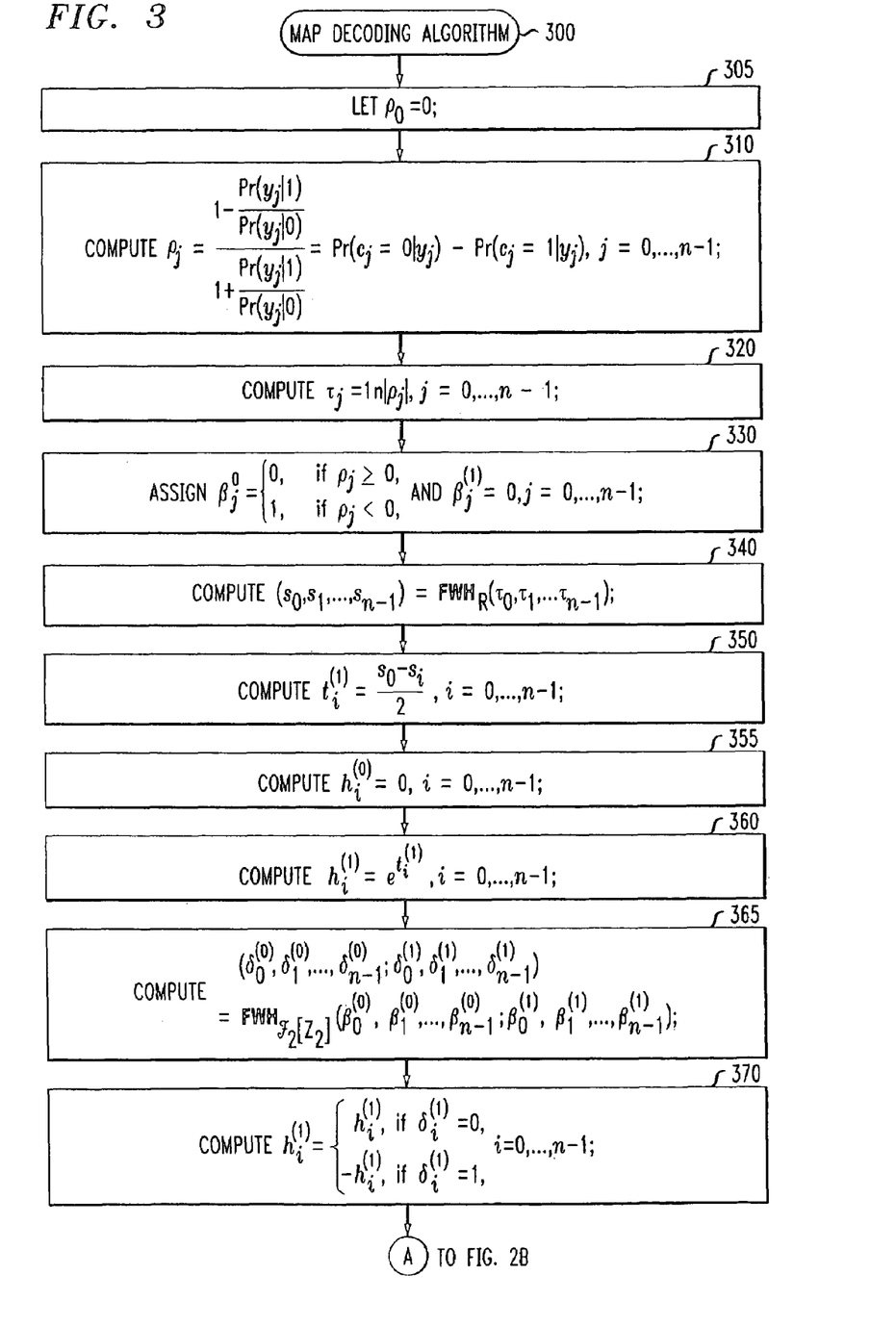
FIG. 3 is a flow chart describing an exemplary implementation of a MAP decoding algorithm of FIG. 1 particularly suited for decoding binary Hamming codes.

As shown in FIG. 3, the MAP decoding algorithm 300 initially defines $\rho_0$, the difference in the probability of receiving a binary zero and binary one at the 0-th position, to a value of zero during step 305. Thereafter, the MAP decoding algorithm 300 computes the difference, $\rho_j$, of the probabilities that transmitted symbol $c_j$ was zero and one based on characteristics of the channel and conditioned on the j-th symbol $y_j$ received from the channel, as follows:

$$\rho_j = \frac{1 - \frac{Pr(y_j|1)}{Pr(y_j|0)}}{1 + \frac{Pr(y_j|1)}{Pr(y_j|0)}} = Pr(c_j = 0|y_j) - Pr(c_j = 1|y_j), j = 0, \ldots, n - 1.$$

Thereafter, the natural log of each ρ is computed during step 320 to permit the efficient computation of the sum of logarithms of probabilities, as opposed to an equivalent product of probabilities, as follows:

$$\tau_j = \ln|\rho_j|, j=0, \ldots, n-1;$$

Since the polarity (+/−) of each of the probability difference values, ρ, was masked by the absolute value employed during step 320, the following β values are computed during step 330 to maintain the polarity information:

$$\beta_j^0 = \begin{cases} 0, & \text{if } \rho_j \geq 0, \\ 1, & \text{if } \rho_j < 0, \end{cases} \text{ and } \beta_j^{(1)} = 0, j=0, \ldots, n-1.$$

The real vector Walsh-Hadamard transform is applied to the τ (magnitude) values during step 340 to find the sum of logs of ρ values, as follows:

$$(s_0, s_1, \ldots, s_{n-1}) = \mathbb{F}W_{\mathbb{R}}(\tau_0, \tau_1, \ldots, \tau_{n-1}).$$

The results of the real vector Walsh-Hadamard transform are then processed during step 350 to compute:

$$t_i^{(1)} = \frac{s_0 - s_i}{2}, i = 0, \ldots, n-1.$$

It is noted that the $t^{(0)}$ term used for the extended Hamming code has been dropped because the Hamming code has only half the number of codewords of the extended Hamming code.

The $h_i^{(0)}$ term that was used for the extended Hamming code is set to zero during step 355 (again, because the Hamming code has only half the number of codewords of the extended Hamming code). Since the exemplary MAP decoding algorithm 300 employs sums of logarithms of probabilities, as opposed to an equivalent product of probabilities, exponentiation is performed during step 360, to obtain the product of ρ values for non-zero positions for all codewords, as follows:

$$h_i^{(1)} = e^{t_i^{(1)}}, i=0, \ldots, n-1.$$

Each h value is a product of the absolute value of ρ values with non-zero entries for all codewords of first order Reed-Muller code. At this point, the MAP decoding algorithm 300 has products of absolute values. To prepare to reintroduce the polarity information and obtain the $\delta_j$ values, a specially designed $\mathcal{F}_2[\mathbb{Z}_2]$-vector Walsh-Hadamard transform is again applied during step 365 to the p (polarity) values, as follows:

$$(\delta_0^{(0)}, \delta_1^{(0)}, \ldots, \delta_{n-1}^{(0)}, \delta_1^{(1)}, \ldots, \delta_{n-1}^{(1)}) =$$
$$FWH_{\mathcal{F}_2[\mathbb{Z}_2]}(\beta_0^{(0)}, \beta_1^{(0)}, \ldots, \beta_{n-1}^{(0)}; \beta_0^{(1)}, \beta_1^{(1)}, \ldots, \beta_{n-1}^{(1)}).$$

The polarity of the probability difference values is then reintroduced during step 370, as follows:

$$h_i^{(1)} = \begin{cases} h_i^{(1)}, & \text{if } \delta_i^{(1)} = 0, \\ h_i^{(1)}, & \text{if } \delta_i^{(1)} = 1, \end{cases} i=0, \ldots, n-1.$$

The second portion of the MAP decoding algorithm 300 (steps 375 through 390) proceeds in the same manner as the corresponding steps of the MAP decoding algorithm 200, discussed above in conjunction with FIG. 2.

It is to be understood that the embodiments and variations shown and described herein are merely illustrative of the principles of this invention and that various modifications may be implemented by those skilled in the art without departing from the scope and spirit of the invention.

We claim:

1. A method for maximum a posteriori (MAP) decoding of a received vector of corrupted transmitted symbols encoded using a code set consisting of a plurality of binary codewords, wherein each of said binary codewords has n positions, wherein each position has a binary value of one or zero, said method comprising the steps of:

for each position, l, $0 \leq \Lambda \leq n-1$ of said received vector, computing a difference, $\rho_l$, of the respective probability that the transmitted symbol had a binary value of one at position l and the probability that the transmitted symbol had a binary value of zero at position l; and determining, for each codeword of a dual code of said code set, a product of $\rho_l$ values corresponding to non-zero positions of codewords of the dual code of said code set using a real vector fast Walsh-Hadamard transform and a $\mathcal{F}_2[\mathbb{Z}_2]$-vector fast Walsh-Hadamard transform.

2. The method of claim 1, wherein said code set is a dual of a Reed-Muller code set.

3. The method of claim 1, wherein said code set is a dual of a code set that is represented as sparse matrices.

4. The method of claim 1, wherein said $\mathcal{F}_2[\mathbb{Z}_2]$-vector fast Walsh-Hadamard transform $(\delta_0^{(0)}, \delta_1^{(0)}, \ldots, \delta_{n-1}^{(0)}; \delta_0^{(1)}, \delta_1^{(1)}, \ldots, \delta_{n-1}^{(1)}) FWH\mathcal{F}_2[\mathbb{Z}_2](\beta_0^{(0)}, \beta_1^{(0)}, \ldots, \beta_{n-1}^{(0)}; \beta_0^{(1)}, \beta_1^{(1)}, \ldots \beta_{n-1}^{(1)})$, further comprises the steps of (i) computing, for j from 0 to n/2−1, $\delta_j^{(0)} = \beta_{2j}^{(0)} \oplus \beta_{2j+1}^{(0)}; \delta_j^{(1)} = \beta_{2j}^{(1)} \oplus \beta_{2j+1}^{(1)}; \delta_{n/2+j}^{(0)} = \beta_{2j}^{(0)} \oplus \beta_{2j+1}^{(1)};$ and $\delta_{n/2+j}^{(0)} = \beta_{2j}^{(1)} \oplus \beta_{2j+1}^{(0)};$ and (ii) assigning $\beta_j^{(0)} = \delta_j^{(0)}$ and $\beta_j^{(1)} = \delta_j^{(1)}$, j=0, . . . , n−1; where n is a length of said codewords, n=$2^m$, β is a variable to maintain polarity information and δ indicates whether a corresponding product of $\rho_l$ values is positive or negative.

5. A method for maximum a posteriori (MAP) decoding of a received vector of corrupted transmitted symbols encoded using a code set consisting of a plurality of codewords, wherein each of said binary codewords has n positions, wherein each position has a binary value of one or zero, said method comprising the steps of:

for each position, l, $0 \leq l \leq n-1$ of said received vector, computing a difference, $\rho_l$, of the respective probability that the transmitted symbol had a binary value of one at positon l and the probability that the transmitted symbol had a binary value of zero at position l;

determining a product of $\rho_l$ values corresponding to non-zero positions of codewords of a dual code of said code set; and for each position, l, of each codeword of a dual code of said code set, determining a sum of modified products of said $\rho_l$ values using a real vector fast Walsh-Hadamard transform, said sum of modified products of said $\rho_l$ values indicating a most probable value of a transmitted symbol.

6. The method of claim 5, wherein said code set is a dual of a Reed-Muller code set.

7. The method of claim 5, wherein said code set is a dual of a code set that is represented as sparse matrices.

8. The method of claim 5, wherein said modified products is obtained for position, l, $0 \leq l \leq n-1$ of each dual codeword by dividing by the $\rho_l$ value if the dual codeword has a first binary value in position l, $0 \leq l \leq n-1$.

9. The method of claim 5, wherein said modified products is obtained for position l, $0 \leq l \leq n-1$ of each dual codeword by multiplying by the $\rho_l$ value if the dual codeword has a second binary value in position l, $0 \leq l \leq n-1$.

10. The method of claim 5, wherein said first determining step uses a real vector fast Walsh-Hadamard transform and a $\mathcal{F}_2[\mathbb{Z}_2]$-vector fast Walsh-Hadamard transform.

11. The method of claim 10, wherein said $\mathcal{F}_2[\mathbb{Z}_2]$-vector fast Walsh-Hadamar transform $(\delta_0^{(0)}, \delta_1^{(0)}, \ldots, \delta_{n-1}^{(0)}; \delta_0^{(1)}, \delta_1^{(1)}, \ldots, \delta_{n-1}^{(1)}) = \text{FWH}\mathcal{F}_{2[Z_2]}(\beta_0^{(0)}, \beta_1^{(0)}, \ldots, \beta_{n-1}^{(0)}; \beta_0^{(1)}, \beta_1^{(1)}, \ldots, \beta_{n-1}^{(1)})$, further comprises the steps of (i) computing, for j from 0 to n/2−1, $\delta_j^{(0)} = \beta_{2j}^{(0)} \oplus \beta_{2j+1}^{(0)}$; $\delta_j^{(1)} = \beta_{2j}^{(1)}$; $\delta_{n/2+j}^{(0)} = \beta_{2j+1}^{(1)}$; and $\delta_{n/2+j}^{(1)} = \beta_{2j}^{(1)} \oplus \beta_{2j+1}^{(0)}$; and (ii) assigning $\beta_j^{(0)} = \delta_j^{(0)}$ and $\beta_j^{(1)} = \delta_j^{(1)}$, j=0, ..., n−1; where n is a length of said codewords, $n=2^m$ $\beta$ is a variable to maintain polarity information and a indicates whether a corresponding product of $\rho_l$ values is positive or negative.

12. A system for maximum a posteriori (MAP) decoding of a received vector of corrupted transmitted symbols encoded using a code set consisting of a plurality of codewords, wherein each of said binary codewords has n positions, wherein each position has a binary value of one or zero, said system comprising:
  a memory that stores computer-readable code; and
  a processor operatively coupled to said memory, said processor configured to implement said computer-readable code, said computer-readable code configured to:
  for each position, l, $0 \leq l \leq n-1$ of said received vector, compute a difference, $\rho_l$, of the respective probability that the transmitted symbol had a binary value of one at position l and the probability that the transmitted symbol had a binary value of zero at position l; and
  determine, for each codeword of a dual code of said code set, a product of $\rho_l$ values corresponding to non-zero positions of codewords of the dual code of said code set using a real vector fast Walsh-Hadamard transform and a $\mathcal{F}_2[\mathbb{Z}_2]$-vector fast Walsh-Hadamard transform.

13. The system of claim 12, wherein said $\mathcal{F}_2[\mathbb{Z}]$-vector fast Walsh-Hadamard transform $(\delta_0^{(0)}, \delta_1^{(0)}, \ldots, \delta_{n-1}^{(0)}; \delta_0^{(1)}, \delta_j^{(0)}, \ldots, \delta_{n-1}^{(1)}) = \text{FWH}\mathcal{F}_{2[Z_2]}(\beta_0^{(0)}, \beta_2^{(0)}, \ldots, \beta_{n-1}^{(0)}; \beta_0^{(1)}, \ldots, \beta_{n-1}^{(1)})$, further comprises the steps of (i) computing, for j from 0 to n/2−1, $\delta_j^{(0)} = \beta_{2j}^{(0)} \oplus \beta_{2j+1}^{(0)}$; $\delta_j^{(1)} = \beta_{2j}^{(1)} \oplus \beta_{2j+1}^{(1)}$; $\delta_{n/2+j}^{(0)} = \beta_{2j}^{(0)} \oplus \beta_{2j+1}^{(1)}$; and $\delta_{n/2+j}^{(0)} = \beta_{2j}^{(1)} \oplus \beta_{2j+1}^{(0)}$; and (ii) assigning $\beta_j^{(0)} = \delta_j^{(0)}$ and $\beta_j^{(1)} = \delta_j^{(1)}$, j=0, ... n−1; where n is a length of said codewords, $n=2^m$, $\beta$ is a variable to maintain polarity information and $\delta$ indicates whether a corresponding product of $\rho_l$ values is positive or negative.

14. A system for maximum a posteriori (MAP) decoding of a received vector of corrupted transmitted symbols encoded using a code set consisting of a plurality of codewords, wherein each of said binary codewords has l positions, wherein each position has a binary value of one or zero, said system comprising:
  a memory that stores computer-readable code; and
  a processor operatively coupled to said memory, said processor configured to implement said computer-readable code, said computer-readable code configured to:
  for each position, l, of said received vector, compute a difference, $\rho_l$ of the respective probability that the transmitted symbol had a binary value of one at position l and the probability that the transmitted symbol had a binary value of zero at position l;
  determine a product of $\rho_l$ values corresponding to non-zero positions of codewords of a dual code of said code set; and
  for each position, l, of each codeword of a dual code of said code set, determine a sum of modified products of said $\rho_l$ values using a real vector fast Walsh-Hadamard transform, said sum of modified products of said $\rho_l$ values indicating a most probable value of a transmitted symbol.

15. The system of claim 14, wherein said modified products is obtained for a given position of each dual codeword by dividing by the $\rho_l$ value for the current position if the dual codeword has a first binary value in the position, l, $0 \leq l \leq n-1$.

16. The system of claim 15, wherein said modified products is obtained for a position, l, $0 \leq l \leq n-1$ of each dual codeword by multiplying by the $\rho_l$ value if the dual codeword has a second binary value in the position l, $0 \leq l \leq n-1$.

17. The system of claim 14, wherein said determining step uses a real vector fast Walsh-Hadamard transform and a $\mathcal{F}_2[\mathbb{Z}_2]$-vector fast Walsh-Hadamard transform.

18. The system of claim 17, wherein said $\mathcal{F}_2[\mathbb{Z}_2]$-vector fast Walsh-Hadamard transform $(\delta_0^{(0)}, \delta_1^{(0)}, \ldots \delta_{n-1}^{(0)}; \delta_0^{(1)}, \ldots, \delta_{n-1}^{(1)}) = \text{FWH}\mathcal{F}_{2[Z_2]}(\beta_0^{(0)}, \beta_1^{(0)}, \ldots, \beta_{n-1}^{(0)}; \beta_0^{(1)}, \ldots, \beta_{n-1}^{(1)})$, further comprises the steps of (i) computing, for j from 0 to n/2−1, $\delta_j^{(0)} = \beta_{2j}^{(0)} \oplus \beta_{2j+1}^{(0)}$; $\delta_j^{(1)} = \beta_{2j}^{(1)} \oplus \beta_{2j+1}^{(1)}$; $\delta_{n/2+j}^{(0)} = \beta_{2j}^{(0)} \oplus \beta_{2j+1}^{(1)}$; and $\delta_{n/2+j}^{(0)} = \beta_{2j}^{(1)} \oplus \beta_{2j+1}^{(0)}$; and (ii) assigning $\beta_j^{(0)} = \delta_j^{(0)}$ and $\delta_j^{(1)} = \delta_j^{(1)}$, j=0, ..., n−1; where n is a length of said codewords, $n=2^m$, $\beta$ is a variable to maintain polarity information and $\delta$ indicate whether a corresponding product of $\rho_l$ values is positive or negative.

* * * * *

UNITED STATES PATENT AND TRADEMARK OFFICE
CERTIFICATE OF CORRECTION

PATENT NO. : 7,168,028 B2  
APPLICATION NO. : 10/285365  
DATED : January 23, 2007  
INVENTOR(S) : Alexei Ashikhmin Page 1 of 2

It is certified that error appears in the above-identified patent and that said Letters Patent is hereby corrected as shown below:

Title Page, Item (75), Inventors, "Ashkhmin" should be replaced by -- Ashikhmin --.

In the Specifications:

In column 9, line 20, "FW" should be replaced by -- FWH --.

In column 10, line 40, "FW" should be replaced by -- FWH --.

In column 11, line 12, "FW" should be replaced by -- FWH --.

In column 11, line 37, "$FWH_{F_i[z-1]}$" should be replaced by -- $FWH_{F_i[z-1]}$ --.

In column 13, line 23, "FW" should be replaced by -- FWH --.

In the Claims:

In claim 1, column 14, line 24, "Λ" should be replaced by -- I --.

In claim 4, column 14, line 42, ") $FWH_{F_i[z]}$" should be replaced by -- ) = $FWH_{F_i[z]}$ --.

In claim 11, column 15, line 22, "$FWH_{F_i[z]}$" should be replaced by -- $FWH_{F_i[z]_L}$ --.

In claim 11, column 15, line 22, "$\delta_o^{(i)}$" should be replaced by -- $\beta_o^{(i)}$ --.

In claim 11, column 15, line 27, "$2^m \beta$" should be replaced by -- $2^m \cdot \beta$ --.

Signed and Sealed this  
Twenty-first Day of May, 2013

Teresa Stanek Rea  
*Acting Director of the United States Patent and Trademark Office*

CERTIFICATE OF CORRECTION (continued)
U.S. Pat. No. 7,168,028 B2

In claim 13, column 15, line 52, "$\delta_j^{(a)}$" should be replaced by -- $\delta_j^{(a)}$ --.

In claim 13, column 15, line 52, "$FWH_{f_2[z]}$" should be replaced by -- $FWH_{F_2[z]}$ --.

In claim 13, column 15, line 53, "$\beta_0^{(i)},...$" should be replaced by -- $\beta_0^{(i)}, \beta_1^{(i)},...$ --.

In claim 18, column 16, lines 45-46, "$\delta_0^{(i)},...,\delta_{n-1}^{(i)})=FWH_{F_2[z]}(\beta_0^{(a)} \beta_1^{(a)},...,\beta_{n-1}^{(a)};\beta_0^{(i)},...,\beta_n^{(i)}$" should be replaced by -- $\delta_0^{(i)},\delta_1^{(i)},...,\delta_{n-1}^{(i)})=FWH_{F_2[z]}(\beta_0^{(a)},\beta_1^{(a)},...,\beta_{n-1}^{(a)};\beta_0^{(i)},\beta_1^{(i)},...,\beta_{n-1}^{(i)}$ --.

In claim 18, column 16, line 49, "$\delta_j^{(i)}=\delta_j^{(i)}$" should be replaced by -- $\beta_j^{(i)}=\delta_j^{(i)}$ --.